United States Patent [19]

Dumont et al.

[11] Patent Number: 4,459,531
[45] Date of Patent: Jul. 10, 1984

[54] POLYPHASE STATIC INVERTER

[75] Inventors: Gilbert C. Dumont; Pierre-Yves Dumont, both of Wavre, Belgium

[73] Assignee: Limitorque Limited, Berkshire, England

[21] Appl. No.: 394,985

[22] Filed: Jul. 2, 1982

[30] Foreign Application Priority Data

Jul. 3, 1981 [BE] Belgium .................................. 889496

[51] Int. Cl.³ .............................................. H02P 1/40
[52] U.S. Cl. .................................... 318/756; 251/154; 318/740
[58] Field of Search ............... 318/739, 740, 756, 748, 318/280, 282, 288, 290, 286, 468, 467, 745; 336/221, 233; 333/112; 251/305, 129, 154; 323/324; 363/63, 124

[56] References Cited

U.S. PATENT DOCUMENTS

| | | | |
|---|---|---|---|
| 3,355,654 | 11/1967 | Riseberg | 363/138 |
| 3,568,020 | 3/1971 | Lisi | 318/756 X |
| 3,710,230 | 1/1973 | VeNard | 363/138 |
| 3,839,662 | 10/1974 | N'Guyen Van | 251/134 |
| 3,972,506 | 8/1976 | Azuma | 251/134 X |
| 4,272,749 | 6/1981 | Tuji | 336/233 |
| 4,376,296 | 3/1983 | Bhagwat | 363/138 |

Primary Examiner—G. Z. Rubinson
Assistant Examiner—Patrick C. Keane
Attorney, Agent, or Firm—Pollock, Vande Sande & Priddy

[57] ABSTRACT

An electrical switching circuit for a multi-phase a.c. supply uses semiconductor rectifier switches SCR1 to 5 to reversibly switch power to a multi-phase electric motor so that the motor can be run in a forward or a reverse direction. The SCRs are provided in two sets, one for switching power to forward run the motor, and the other set for reverse running of the motor. Inductor elements ΔL are connected in series with the SCRs. The inductor elements comprise coils which include a non-linear permeability core, for example of ferrite or permalloy, which are operative to suppress voltage transients at switch on of the motor. These transients would otherwise produce spurious firing of the SCRs and could produce a short circuit across the input phases of the a.c. supply. The circuit is used in a valve actuator. Improved torque limit switches and position limit switches are disclosed, which operate a low voltage and which use Reed and Hall effect switches.

15 Claims, 5 Drawing Figures

POLYPHASE STATIC INVERTER

FIELD OF THE INVENTION

This invention relates to an electrical circuit for switching a multi-phase a.c. supply to a load, and has particular application to reversibly switching a three phase a.c. supply to an electric motor, for running, stopping and reversing the motor.

The invention can be used with particular advantage to control an electric motor used to drive a valve actuator.

BACKGROUND TO THE INVENTION

Electrically driven valve actuators are well known and have been used for many years to drive valves for controlling hydraulic and pneumatic flows in industrial process plants, for example in the operation of butterfly valves used in oil refineries. A known valve actuator, for example our Limitorque Model SMC 2005, comprises a three phase electric motor which drives a reduction gearing having an output for connection to a valve to drive its valve member. The reduction gearing and the motor are mounted in a heavy explosion proof cast metal housing. Mounted in a compartment within the housing is a set of electrical contactors which switch a three phase electrical supply to the motor so that the motor can be stopped, started and reversed. The contactors are operated by relay coils themselves driven from a single phase of the a.c. supply. The contactors include a mechanical interlock arrangement to prevent simultaneous connection of the supply phases for both forward and reverse running of the motor as this would provide a short circuit across the three phases of the supply.

Mounted on the housing is a switch arrangement for switching current to the relay coils, for stopping starting and reversing the motor. The reduction gearing drives a set of position switches which indicate predetermined positions in the range of travel of the valve member. The switches thus may operate to define a fully open, a fully closed and two intermediate positions of the valve member. Also, a torque limit is provided, the torque limit switch being operated when the motor torque applied to the valve member exceeds a given level, for example in response to a foreign object becoming jammed in the valve. The switches are arranged to switch a single phase of the a.c. supply and are interconnected in a manner to control operation of the relays that switch electrical power to the motor. Thus, for example, the motor is arranged to switch off or reverse in response to the fully open limit switch being operated. Other similar motor operating constraints can be set up utilising the switches.

A disadvantage of this arrangement of switches is that they operate at the supply voltage, typically 120 volts or more. As a result the contacts of the switches have to be of a heavy duty nature and in practice are coated in silver. Moreover, heaters are in general provided to prevent condensation from producing a short circuit across the contacts. Also, at the supply voltage, there is a risk of arcing at the switch contacts and consequently precautions have to be taken in case an explosive gas mixture builds up in the housing which would be ignited by the arc. The component parts of the housing are machined to a close tolerance in the region where they engage one another and one of the parts is provided with a flange which prevents a flame front established within the housing from working through the joint between the housing points, to outside the housing, so as to prevent an explosion or fire becoming established outside of the valve actuator housing. Another disadvantage of this known arrangement is that the switches, relays and their contacts are bulky and take up a significant amount of space in the housing.

In practice three separate housing compartments are provided to receive the switches and relays and each compartment needs to be provided with an explosion proof seal as aforesaid.

SUMMARY OF THE INVENTION

In accordance with the present invention semiconductor rectifiers are used to switch a multi-phase electrical supply to a load. A semiconductor rectifier can be switched between conductive and non-conductive conditions by applying an appropriate low voltage control signal to a gate electrode of the rectifier. The control signal can be at a substantially lower voltage than the supply voltage. Thus, when the invention is embodied in a valve actuator, the position switches and the torque limit switch can be operated at a voltage less than the supply voltage, and thus the switches can be embodied as low voltage switches of a much simpler construction and can be much more compact than heretofore thereby reducing the number of compartments required in the housing for the switches. Also, because the low voltage switches are less likely to produce arcing the requirements for an explosion proof seal between the parts of the housing which form the switch compartment, are reduced substantially. It will be appreciated that the cast and machined metal housing constitutes a substantial part of the cost of the valve actuator and thus the present invention provides a substantial reduction in the cost of a valve actuator.

Semiconductor rectifiers have not been used extensively to reversibly switch a multi-phase supply to an electric motor because of problems of spurious switching of the rectifiers. If two sets of semiconductor rectifiers are provided, for connecting the various a.c. phases to the motor for forward and reverse running of the motor respectively, and one of the sets is fired to a conductive condition, the transients produced by switching on of the first set of semiconductor rectifiers can produce spurious switching of the rectifiers of the second set with the result that a short circuit is produced between the various phases of the supply, which would either blow a fuse or damage the equipment.

In order to overcome this problem the present invention is particularly characterised by the provision of inductor elements associated with the semiconductor rectifiers, the inductor elements having inductively coupled thereto a core with a non-linear permeability, the inductors being operative to suppress switching transients of the rectifiers which could otherwise produce spurious interactive rectifier switching.

The present invention thus permits a three phase supply to a valve actuator motor to be switched reliably with semiconductor rectifiers, thus enabling the motor to be run repeatedly in forward and backward directions to control opening and closing of the valve, and by utilising semiconductor rectifier switches the aforementioned substantial improvements in cost and simplicity of the motor switch gear can be achieved.

More particularly, the present invention enables low voltage Hall effect switches to be used for the position switches of the valve actuator, and Reed or Hall effect switches can be used for the torque limit switch.

Further features and advantages of the invention will appear from the following description of an embodiment thereof given by way of illustrative example with reference to the accompanying drawings.

DESCRIPTION OF PREFERRED EMBODIMENTS

Figure 1:
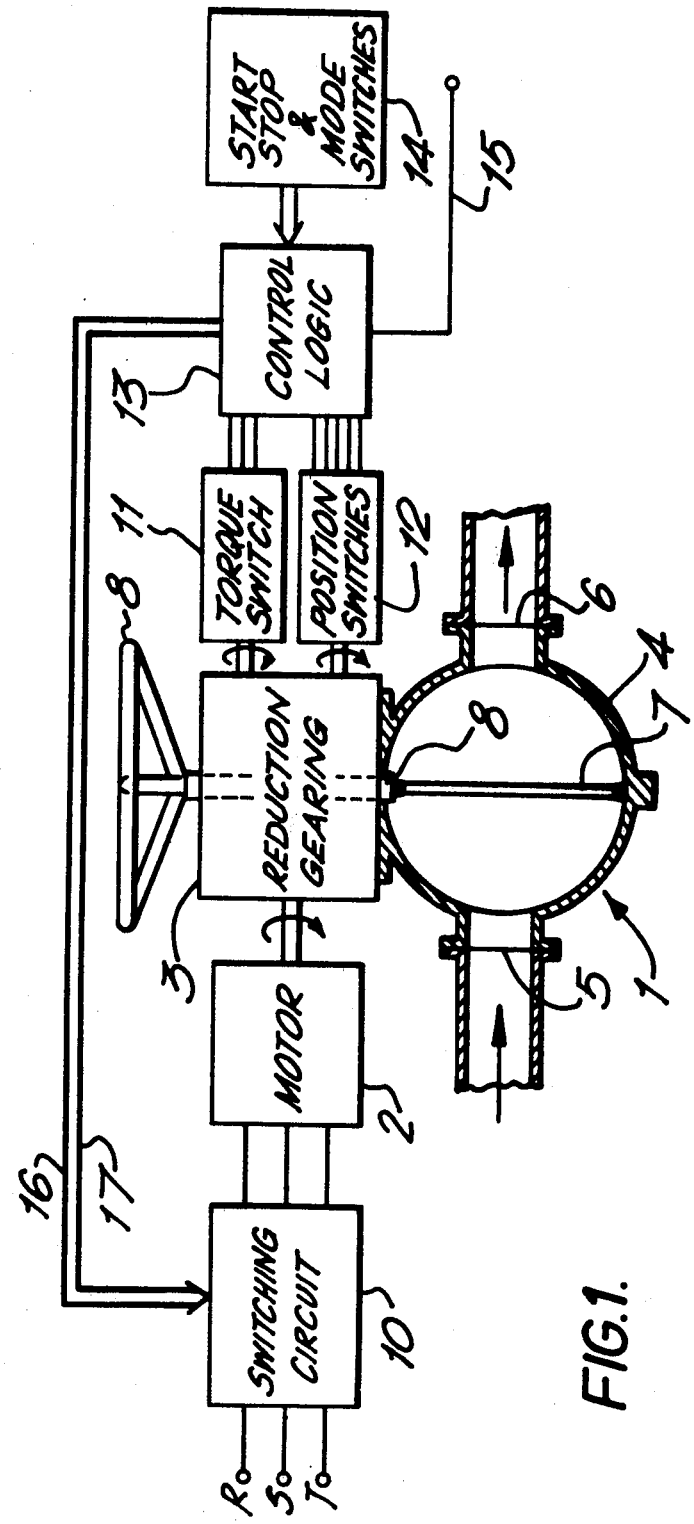
FIG. 1 is a schematic view of a butterfly valve provided with a valve actuator in accordance with the present invention.

Referring firstly to FIG. 1, there is shown a butterfly valve 1 driven by a valve actuator that includes a three phase a.c. electric motor 2 which drives the valve 1 through reduction gearing 3. The butterfly valve 1 comprises a body 4 having inlet and outlet parts 5, 6. The valve has a movable valve member 7 in the form of a disc rotatable through 90° between open and closed positions of the valve. The disc 7 is rotated by a shaft 8 driven by the motor 2 through the reduction gearing 3, or is driven manually by means of a handwheel 9. The motor is powered by a three phase a.c. supply R.S.T. under the control of a switching circuit 10 which utilises semiconductor rectifier switches to stop, start and reverse the motor.

The reduction gearing 3 drives a torque switch 11 which as is explained in more detail hereinafter, includes low voltage Reed switches operated when the motor torque exerted on the valve member 7 exceeds a preset level. The reduction gearing also drives position switches 12. The switches 12 comprise a gear train provided with four cams that are operated at predetermined positions of travel of the valve member to define fully open, fully closed and two intermediate positions of the valve member. The cams are each provided with a magnet which, upon movement of the cam operates a Hall effect switch.

The outputs of the Hall effect switches, and the Reed switches of the torque switch 11 are fed to a control logic circuit 13. This is a low voltage solid state logic circuit powered from a low voltage d.c. supply derived by a conventional power supply (not shown) from a single phase of the a.c. supply to the motor 2. The logic circuit 13 is also responsive to forward, reverse and stop switches and a mode switch, all illustrated schematically by block 14. The switches 11, 12 and 14 are fed with a low voltage d.c. potential by the control logic circuit 13 and the switches develop logic signals which are processed by the circuit 13.

The motor 2, the gearing 3, the switches 11, 12 and the circuits 10 and 14 are all mounted in a common explosion proof cast metal housing (not shown) with the switches 14 being mounted in the housing for operation from outside the housing. The mode switch is operable to render the control logic 13 responsive to control signals supplied from a remote location as shown schematically by input lead 15, to enable the valve motor to be controlled from a remote location, for example in dependence upon the degree of opening of other valves in an industrial process plant.

The logic control circuit 13 provides two output signals on lines 16,17 for application to the gates of the semiconductor rectifiers of the switching circuit 10. The control circuit 13 thus controls the forward and reverse running of the motor 2, the logic 13 being arranged to prevent certain operations of the motor in certain predetermined conditions. For example, if the motor has driven in a forward direction to close the valve such that the position switches 12 indicate the valve to be fully closed, the logic circuit 13 will inhibit further forward running of the motor and will only permit its operation in a reverse direction. Also, if the torque switch 11 is operated when the position switches indicates the valve not to be fully opened or closed, this indicates that a foreign body is in the valve and the logic circuit 13 will stop the motor, hopefully to release the foreign body. It will be appreciated that the logic control circuit may define other non-allowable motor operating conditions in response to the occurance of given combinations of events defined by the states of the switches 11, 12 and 14.

Figure 2:
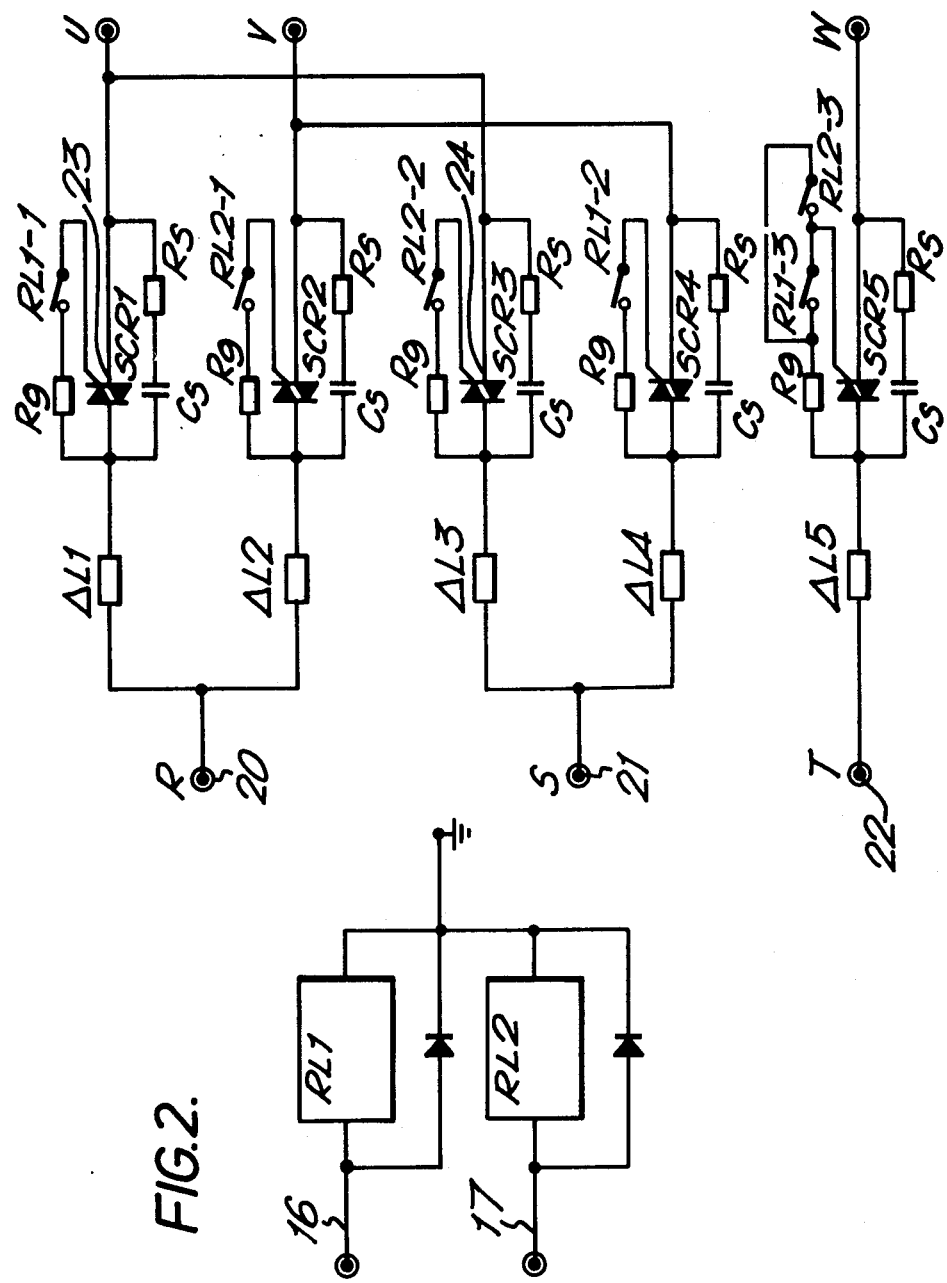
FIG. 2 is a schematic circuit diagram of an embodiment of the switching circuit shown in FIG. 1.

The motor switching circuit 10 will now be described in detail with reference to the embodiment thereof shown in FIG. 2. The three input phases R.S.T. of the a.c. supply are fed to input terminals 20,21,22 and the three phase inputs of the motor 2 are connected to terminals U.V. and W. Semiconductor rectifier switches in the form of triacs SCR1-5 control the connection of the input phases R.S.T. to the terminals U.V.W. To run the motor in a forward direction the phases are connected as follows:

R to U, S to V and T to W. To reverse the motor the connection of the R and S phases is reversed, and the connections are as follows:

R to V, S to U, and T to W.

Thus, to run the motor forwardly, triacs SCR1, 4 and 5 need to be fired to a conductive state, which is achieved by means of a relay comprising a coil RL1 and switching contacts RL1-1, 2 and 3. The relay coil RL1 is energised in response to a control signal on line 16 from the control logic circuit 13 of FIG. 1, the control signal being indicative that the motor is to be run forwardly. Each of the relay contacts is connected in series with a dropping resistor Rg so that when the contacts are closed a suitable gate potential is derived from the a.c. supply and applied to the gates of SCR1, 4 and 5 to fire them to a conductive state. When the control signal on line 16 ceases, the relay RL1 is released, thus opening the contacts RL1-1 to RL1-3, thus causing the SCRs 1, 4 and 5 to switch off and stop the motor.

Reverse running of the motor is controlled in a similar way by means of a relay RL-2 having a coil energised by a reverse running signal on line 17 from the control logic circuit 13 of FIG. 1. The relay RL2 has contacts RL2-1, 2, 3 which when closed, fire SCRs 2, 3 and 5 to a conductive state.

It will be appreciated that the electric motor 2 connected to the terminals U V and W essentially comprises an inductive load. Considering for the moment the triac SCR1, when it has been conductive and is then switched off, transients occur which would produce spurious firing of the triac if the following precautions were not taken. Upon switching off of the triac SCR1 a substantial rapidly rising transient back emf is developed in the motor coils and the back emf is applied to SCR1. In response to such rapid transients, the impedance presented by the switched off triac SCR1, is defined predominately by the capacitances of the pn junctions on either side of the SCR's gate and thus, in the presence of the transient the SCR's equivalent circuit is two capacitors connected in series and on opposite sides of the gate electrode. The rapidly rising back emf can cause charge to build up in the capacitors defined by the triacs pn junctions so as to raise the gate potential sufficiently to retrigger the triac into conduction. To prevent such spurious re-triggering of the triacs, a snubber circuit comprising a snubber resistor Rs and a snubber capacitor Cs, provides a by-pass for the transient back emfs. The time constant of the snubber circuit is selected so that at the a.c. frequency of the supply, the snubber circuit presents a high impedance, but at the high frequency of the transient back emfs the transient currents pass preferentially through the snubber circuit so as to bypass SCR1, thereby to prevent the spurious firing. Each of the SCRs 1 to 5 is provided with its own snubber circuit Cs Rs.

Another problem of spurious firing of the triacs occurs at switch on of the motor. It is to be noted that each of the input phases R and S can be selectively connected to the terminals U V by means of the SCRs 1 to 4, so that the motor can be run both forwardly and backwardly. Thus, there is a danger that the transients produced on switching on of say SCR1 will produce spurious firing of SCR3, which would result in a short circuit being produced across the phases R and S. A similar short circuit could be established if SCRs 2 and 3 became conductive simultaneously.

Considering now the switching on of SCR1, when the relay RL 1 is operated, a gate potential is applied to SCR 1 and it switches on. Consequently the potential at its cathode 23 rises to the potential of the input phase R. Thus, a very rapid rise of voltage could occur which if the precautions discussed hereinafter were not taken, would produce spurious firing of SCR 3. It will be appreciated that a substantially rectangular step wavefront could be established at the cathode 23 of SCR 1, which would be applied to cathode 24 of SCR 3. This step wavefront has a substantially greater rate of rise than the back emfs developed upon switching off of the SCRs and consequently the snubber circuit Cs Rs associated with SCR 3 would be unable to suppress the rapid voltage rise at the cathode 24. As a result, the rapid voltage rise associated with the switching on of SCR 1 would be likely to produce spurious firing of SCR 3 as a result of the transient voltage rise raising the gate potential of SCR 3. Similarly, firing on SCR 3 could produce spurious firing of SCR 1 and SCRs 2 and 4 would interact in a similar manner.

A similar problem arises when the phases R S and T are initially connected to the terminals 21, 22 and 23. Again, a step wavefront would be applied to the SCRs 1 to 5 which could produce simultaneous spurious firing of the SCRs, thereby producing a short circuit across the phases.

Such spurious firing and short circuiting of the phases is prevented in accordance with the invention, by providing in series with the SCRs 1 to 5 respective inductor coils ΔL1-5 each provided with a core of a material exhibiting a non-linear permeability. The permeability of the core varies as a non-linear function of the frequency and magnitude of the applied field, and the core is typically made of ferrite material i.e. sintered carbides. The core may also be made of permalloy, for example Molypermalloy manufactured by Magnetics, a division of Spang Industries Inc., P.O. Box 391, Butler Pa, 16001, U.S.A. or powdered soft iron.

The inductor coils ΔL have the effect of reducing the rate of rise of current to which the SCRs are subjected so that no spurious firing occurs. By using a non-linear permeability core, the inductors appear to operate preferentially on the rapid transients which occur upon switch on; if a solid soft iron bar is used, as the core inductors are heated by the a.c. supply whilst the motor is running. Conversely if no core is used in the inductors, resonance at radio frequencies may be produced in response to switching of the SCRs 1 to 5.

The provision of the inductors ΔL1 to 5 has been found to provide reliable switching of the SCRs 1 to 5, with spurious firing having been entirely eliminated.

Figure 3:
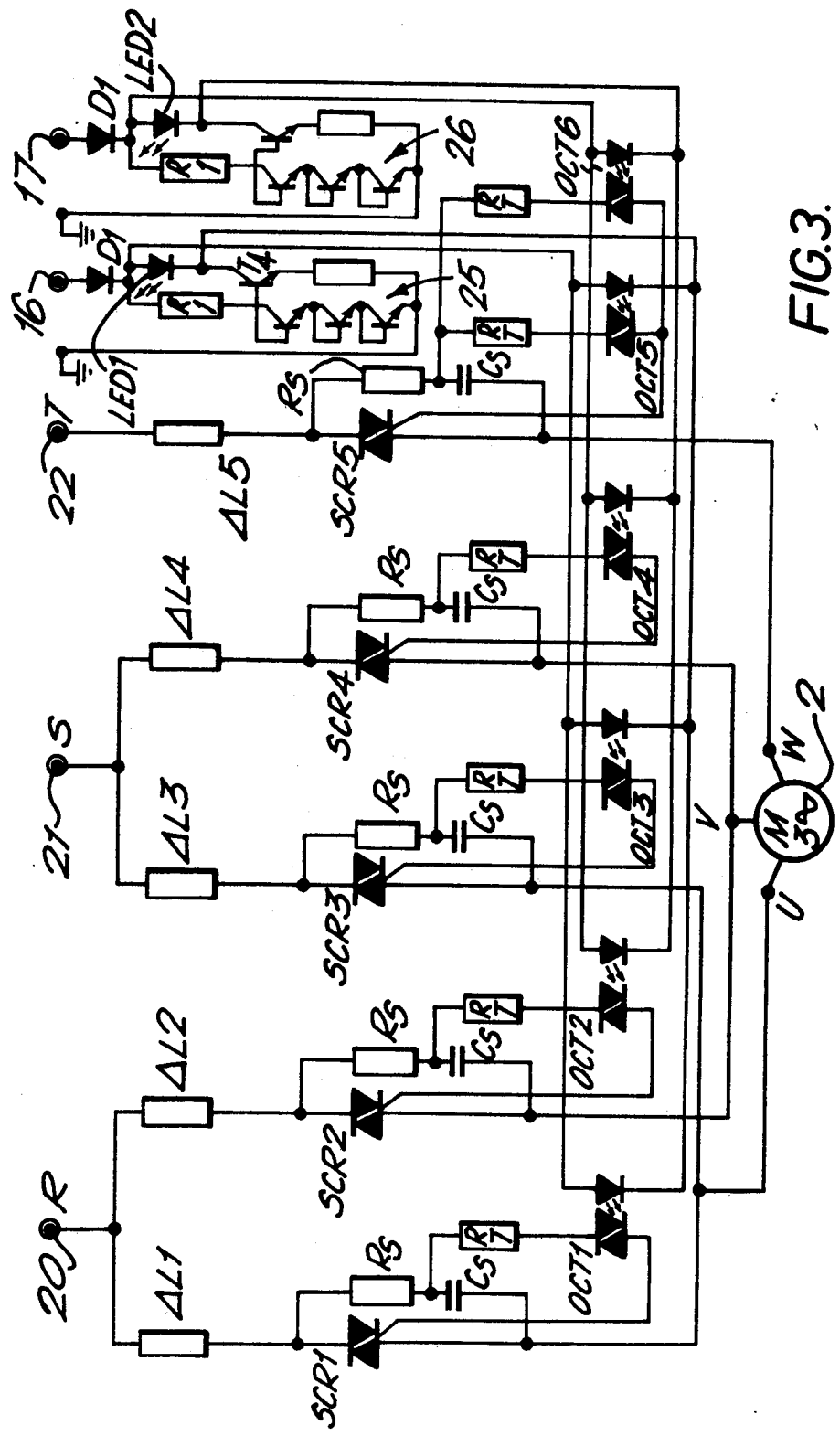
FIG. 3 is a schematic circuit diagram of another embodiment of the switching circuit.

Another embodiment of the switching circuit 10 is shown in FIG. 3. The circuit is generally similar to that of FIG. 2 and like parts are marked with the same reference numerals. The main difference is that instead of using the relays RL1, 2 to fire the SCRs, opto-triacs OCT1-6 are used. Opto-triacs operate in a similar manner to a conventional triac, but the gate thereof is activated by photons injected by a photo diode. The optical injection of photons provides a high level of electrical isolation between the potential applied to the gate input and the current path between the anode and cathode.

The photo-diodes of the opto-triacs OCT1-6 are connected to respective constant current sources 25, 26 driven in response to the control signals on lines 16, 17. The constant current sources 25, 26 also drive light emitting diodes LED 1, LED 2 which indicate if the motor is running in a forward or reverse direction.

Figure 4:
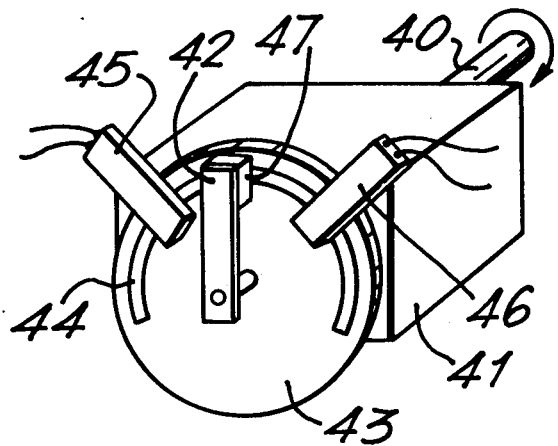
FIG. 4 is a schematic illustration of the torque switch of FIG. 1.

Referring now to FIG. 4, this shows an embodiment of the torque switch 11 of FIG. 1. A shaft 40 is rotated by the reduction gearing 3 of FIG. 1 and drives a mechanical arrangement within a box 41, which rotates a wiper arm 42 through an angle dependant upon the torque exerted on the shaft 40. The arrangement within the box 41 typically comprises a slipping clutch device which rotates a shaft on which the arm 42 is mounted against the force of a spring. This slipping clutch arrangement is conventional and per se does not form part of the invention; the arrangement may correspond to that used in our Limitorque Model SMC valve actuators. A disc 43 is mounted on the box 41, the disc being provided with an annular slot 44 concentric with the axis of rotation of the wiper arm. Mounted in the slot are two Reed switches 45, 46. The angular positions of the switches 45, 46 can be adjusted around the slot. The wiper arm 42 carries a magnet 47 for activating the switches.

When no torque is applied to the shaft 40, the wiper arm assumes the position shown. However, when torque is applied, the wiper arm rotates through an angle which is indicative of the applied torque, the wiper 42 moving clockwise or anticlockwise depending on whether the motor is running in a forward or backward direction. The positions of the Reed switches 45, 46 thus define preset torque limits for forward and backward running of the motor; if the wiper arm is displaced to overlie one of the Reed switches it is operated by the magnet 47 to indicate the application of excessive torque to the valve member 7.

It will be appreciated that the Reed switches could be replaced by Hall effect switches if desired. The described arrangement has the advantage that it operates at low voltage, typically 5 v and the switches are encapsulated, thus with no possibility of arcing thereby reducing the risk of explosion in the presence of a combustible gas mixture.

Figure 5:
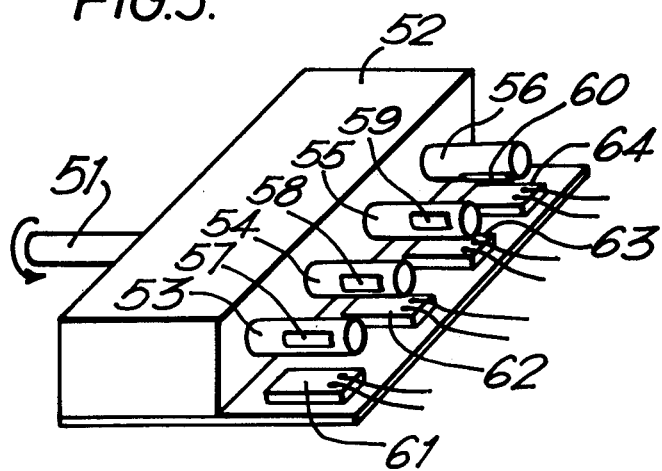
FIG. 5 is a schematic illustration of the position switch of FIG. 1.

FIG. 5 illustrates an embodiment of the position switches 12 of FIG. 1. A shaft 51 is driven by the gear train 3 of FIG. 1 and the shaft 51 drives a gear arrangement within a box 52. The gear arrangement in box 52 may correspond to that used in our Limit switch utilised in our Limitorque SMC valve actuators. The gear arrangement 52 has four output stub shafts 53, 54 55, 56 on which are mounted respective permanent magnets 57–60. Beneath the stub shafts are mounted respective Hall effect switches 61–64. The stub shafts 53–56 are rotated at predetermined positions of travel of the valve member. Normally, the stub shafts are positioned with the magnets 57–60 disposed in a position away from the Hall effect switches, but when the valve member moves to a predetermined position, the shaft e.g. shaft 56 is rotated, so as to bring the magnet 60 closer to the Hall effect switch 64 to operate it. It will be appreciated that this arrangement has the advantage that the switches operate at low voltage, typically 5 volts, with no possibility of arcing.

We claim:

1. An electrical circuit for multi-phase switching of an a.c. electrical supply to a load, comprising input terminals for receiving respective different phases of an a.c. supply, output terminals for supplying the different phases to the load, means defining current paths between said input and said output terminals, said paths connecting the input terminals to respective ones of the output terminals in a first or a second different predetermined relationship, each of said current paths including a respective semiconductor rectifier switching means for rendering the path conductive or non-conductive, said paths further including respective inductors, each comprising a coil having a core of non-linear permeability material which varies as a non-linear function of the frequency and magnitude of an applied field, whereby transients which spuriously render conducting an adjacent semiconductor switching means are inhibited.

2. An electrical switching circuit according to claim 1 including for each said semiconductor rectifier switching means, means for deriving from the current path in which said rectifier is included an electrical potential for application to a gate input of the rectifier, and a switching device for selectively connecting the potential to the gate.

3. An electrical switching circuit according to claim 2 wherein the switching devices include first and second relays, the relays each having a plurality of switching contacts connected for applying selectively said potentials to respective ones of the rectifier gates, said first relay being arranged on operation thereof to render a first set of the semiconductor switching means conductive whereby to establish said first predetermined relationship of interconnection between the input and output terminals and said second relay being arranged on operation thereof to render a second set of the semiconductor switching means conductive whereby to establish said second different relationship.

4. An electrical switching circuit according to claim 1 or 2 wherein the switching devices comprise opto-triacs, and including means for rendering a first set of said opto-triacs conductive to establish said first predetermined relationship, and means for rendering a second set of said opto-triacs conductive so as to establish said second predetermined relationship.

5. An electrical switching circuit according to claim 1 wherein said core is made of ferrite material.

6. An electrical switching circuit according to claim 1 wherein said core is made of a permalloy.

7. The electrical circuit of claim 1 wherein said respective inductors are located between a respective input terminal and a respective semiconductor rectifier switching means.

8. An electric motor control system comprising a multi-phase electric motor having a plurality of motor terminals to receive respective different phases of multi-phase a.c. supply, and an electrical switching circuit for reversibly switching a multi-phase a.c. supply to the motor terminals, the circuit comprising input terminals for receiving different phases of a multi-phase a.c. supply; means defining current paths between said input terminals and said motor terminals, said paths connecting the input terminals to respective ones of the motor terminals in a first or a second predetermined relationship for forward or reverse running of the motor, each of said current paths including a respective semiconductor rectifier switching means for rendering said path conductive, said paths further including inductors, each comprising a coil having inductively coupled thereto a non-linear permeability material, and control means operative to a first condition to render a first set of said semiconductor switching means conductive so as to connect said terminals in said first predetermined relationship for forward running of the motor, said control means being further operative to a second condition to render a second different set of said semiconductor rectifier switching means conductive so as to connect said terminals in said second predetermined relationship for reverse running of the motor, said inductors, having a permeability which varies as a non-linear function of the frequency and magnitude of an applied field, thereby inhibiting transients produced by switching on said first or said second set of the semiconductors rectifier switching means, whereby transients which spuriously render conductive the remaining of said semiconductor rectifier switching means are inhibited.

9. A control system according to claim 8 wherein each of said semiconductor rectifier switching means has connected in parallel therewith a snubber circuit comprising a series connected resistor and capacitor which prevent spurious firing of the switching means in response to back emfs produced by the motor upon said switching means being rendered non-conductive.

10. A control system according to claim 8 or 9 wherein said motor is a three phase motor and wherein said switching circuit reverses the connection of two of the phases supplied to the motor terminals in said second predetermined relationship as compared with said first relationship.

11. A valve actuator comprising:
a reversible multi-phase electric motor having a plurality of motor terminals to receive respective different phases of a multi-phase a.c. supply,
reduction gearing reversibly driven by the motor, the reduction gearing having an output coupling for driving a valve between open and closed conditions thereof, an electrical switching circuit for reversibly switching a multi-phase a.c. supply to the motor terminals, the switching circuit comprising input terminals for receiving different phases of a multi-phase a.c. supply, means defining current paths between said input terminals and said motor terminals, said paths connecting the input terminals to respective ones of the motor terminals in a first or a second predetermined relationship for forward or reverse running of the motor, respectively, each of said current paths including respective semiconductor rectifier switching means and respective inductors having inductively coupled thereto non-linear permeability material which varies as a non-linear function of the frequency and magnitude of an applied field, first control means for rendering conductive a first set of the semiconductor rectifier switching means such as to establish forward running of the motor, second control means for rendering conductive a second set of the semiconductor rectifier switching means so as to establish reverse running of the motor, said inductors upon said first set being rendered conductive by said first control means preventing spurious firing of the second set and upon said second set being rendered conductive by said second control means preventing firing of the first set, position switches driven by said gearing defining predetermined positions of travel of the valve, a torque switch driven by said gearing providing a signal when the motor torque exceeds a predetermined value, and logic control means responsive to said position switches and the torque switch for operating said first and second control means, said logic control means defining predetermined allowable operating conditions for the motor.

12. A valve actuator according to claim 11 wherein said control means and said logic control means and said torque and position switches operate with a d.c. supply derived from said a.c. supply, said d.c. supply being of a substantially lower voltage than the a.c. supply.

13. A valve actuator according to claim 11 wherein said torque switch comprises a torque responsive member, means for moving the torque responsive member by an amount dependant upon the motor torque applied to the gear train, a magnet carried by said torque responsive member, and a switch mounted in a predetermined position and operative to switch in response to the magnet being moved over the switch.

14. A valve actuator according to claim 13 wherein said switch comprises a reed switch.

15. A valve actuator according to claim 11 wherein said position switches comprise Hall effect switches.

* * * * *